United States Patent [19]
Bennett et al.

[11] Patent Number: 5,105,449
[45] Date of Patent: Apr. 14, 1992

[54] NON-VOLATILE COUNTER EMPLOYING MEMORY CELL GROUPS AND FAULT DETECTION LOGIC

[75] Inventors: Daniel H. Bennett, Guildford; Gary L. Dodd, East Molesey; Kenelm G. D. Murray, Chiddingfold, all of United Kingdom

[73] Assignee: Hughes Microelectronics Limited, Glenrothes, Scotland

[21] Appl. No.: 554,045

[22] Filed: Jul. 17, 1990

[30] Foreign Application Priority Data

Jul. 13, 1989 [GB] United Kingdom ............... 8916017

[51] Int. Cl.⁵ ................... G06F 11/00; H03K 21/40
[52] U.S. Cl. .......................... 377/28; 377/24.1; 377/26; 371/10.2; 371/11.1
[58] Field of Search .................. 377/24.1, 26, 28; 371/10.2, 11.1

[56] References Cited

U.S. PATENT DOCUMENTS

| | | | |
|---|---|---|---|
| 3,331,058 | 7/1967 | Perkins | 371/102 |
| 4,483,001 | 11/1984 | Ryan | 371/11.1 |
| 4,566,102 | 11/1986 | Hefner | 371/11.1 |
| 4,682,287 | 7/1987 | Mizuno et al. | 377/24.1 |
| 4,727,516 | 2/1988 | Yoshida et al. | 371/10.2 |
| 4,757,522 | 7/1988 | Kieselstein | 377/24.1 |
| 4,774,712 | 9/1988 | Lewis | 371/10.2 |
| 4,807,264 | 2/1989 | Bauer | 377/24.1 |
| 4,947,410 | 8/1990 | Lippmann et al. | 377/26 |

*Primary Examiner*—John S. Heyman
*Attorney, Agent, or Firm*—Terje Gudmestad; Jeanette M. Walder; W. K. Denson-Low

[57] ABSTRACT

A counter includes an array of memory cells arranged in groups of memory cells, each group designating a counting decade, wherein each group of memory cells includes first and second word strings, each capable of storing a data word, and a fault flag, capable of indicating which word string contains the data word; sensing means coupled to the memory array for checking the status of the memory cells and for generating fault signals upon detection of a fault in a memory cell; logic means coupled to the memory cells and to the sensing means for selecting the first or second word string in response to a fault signal; wherein upon detection of a fault in a first word string, the data word is written into the second word string; and a central shifting unit coupled to the memory array for reading a data word stored in a word string into the shifting unit, incrementing the data word, and writing the incremented data word into its respective word string.

3 Claims, 2 Drawing Sheets

| FAULT | X | FRXnor FRX' | WX | WX' |
|---|---|---|---|---|
| 0 | 0 | 0 | 0 | 0 |
| 0 | 0 | 1 | 0 | 0 |
| 0 | 1 | 0 | 1 | 0 |
| 0 | 1 | 1 | 0 | 1 |
| 1 | 0 | 0 | 0 | 0 |
| 1 | 0 | 1 | 0 | 1 |
| 1 | 1 | 0 | 1 | 1 |
| 1 | 1 | 1 | 1 | 1 |

NON-VOLATILE COUNTER EMPLOYING MEMORY CELL GROUPS AND FAULT DETECTION LOGIC

The present invention relates to a non-volatile counter which makes efficient use of its memory cells by transferring a data word from an imperfect area of memory to another area of the memory.

Prior art electronic counters are known which incorporate counter decades implemented as twisted ring counters (supporting five-bit Johnson coding) or which include decades represented simply by a word in an array of non-volatile RAM (NVRAM) (as disclosed in EP-273954U.S. Pat. No. 4,839,909). Such prior art counters achieve their function by reading the contents of the word into a Central Shifting Unit (CSU) where the word is incremented (shifted) and then written back into the memory word. This arrangement saves memory area by avoiding the need for many separate non-volatile shift registers. When a decade changes from its highest state to zero, a carry is recorded and the next decade is incremented. The CSU addresses each decade in turn, from least significant to most significant, performing increments as necessary. All this is done under the control of a sequencer circuit. On completion of this sequence the whole NVRAM array is written into its non-volatile shadow, where it remains until the next counting operation is triggered.

Such prior art counters, and counters according to the present invention, are used for applications such as odometers, elapsed time recorders and event counters. The present invention is designed to improve the confidence with which high numbers of counts may be made. With this in mind, since such uses by nature incorporate a "macro cell", the present invention can be included in many circuits with minimal modification, thus reducing chip design time.

According to the present invention there is provided a non-volatile counter comprising:
an array of memory cells incorporating groups of cells, each group of cells being divided into word strings capable of storing data words and associated fault flags;
sensing means for checking the status of the memory cells and for issuing fault signals to the fault flags; and
logic means responsive to the fault signals and fault flags for selecting the word strings;
wherein the memory cells each include at least two non-volatile transistors and wherein on detection of a fault in a word string the stored data word is written into a second word string.

Non-volatile memory cells (each having two or more non-volatile transistors) which are suitable for incorporating in a counter according to the present invention are disclosed in detail in U.K. Patent application U.S. patent application Ser. No. 07/554,046 filed July 17, 1990.

The design of the counters according to the present invention differ from the prior art in that most of the strings of cells in the memory array are duplicated, and a system exists for selecting between the default and spare string for each data word. In a preferred embodiment of the invention which has six counting decades (100K's, 10K's, 1K's, 100's, 10's and 1's), only the lower four decades are provided with back up data word strings on the basis that the 100K and 10K registers are not worked sufficiently heavily to justify it. In this regard, the non-volatile transistors suffer from endurance limitations; as the number of reprogrammings increases, so the performance of a transistor is impaired until failure becomes probable. The spare data word string is brought into action once one of the transistors in the default word fails (though, thanks to two-transistor redundancy, data is not lost). The counting then continues in a new, un-endured string of memory cells.

Preferably each sensing means and each logic means are associated with only a single group of memory cells.

Fault flags associated with the two highest decades (100K and 10K decades) are preferably hard-wired out of the memory array for providing "overflow" or "tamper" information or, alternatively, a "world fault report".

The sensing means associated with a group of memory cells is preferably activated each time a string of cells in the group stores a data word having the value "0".

In a preferred embodiment of the invention, each string of cells includes six memory cells, five for storing the data word and one for the fault flag.

If all of the strings of cells in a particular group of memory cells have their fault flags activated, it is preferable that each string is utilized sequentially such that no one string is over-endured.

An improvement which is preferably included in the counter system is that of "mapping", disclosed in U.K. Patent 2171543 U.S. Pat. No. 4,663,790, which involves rotating the significance of the decades. By sharing the work load among the lower decades, such that there is no one decade which suffers heavy endurance, the life of the counter is extended. Mapping may be applied very easily to the counter of the present invention, as each pair of default and spare words is addressed along a single word line. Selection of default or spare word preferably takes places after the mapping process.

A specific embodiment of the present invention is now described purely by way of example with reference to the accompanying drawings, in which:

FIG. 2a is a schematic diagram of the logic circuitry included in the embodiment shown in FIG. 1; and FIG. 2b is a Truth table corresponding to the logic circuit shown in FIG. 2a.

With reference to the drawings, the counter includes an array of memory cells formed as groups 1a-1e of cells, sensing means 3a-3d, logic means 5a-5d, an address decoder/mapper 7 and a central shifting unit (CSU) 9. Each group 1 of cells is divided into two strings X, X' of cells, each string having five non-volatile memory cells for storing a data word and a sixth memory cell which acts as a fault report flag (FR).

Four of the groups 1 of memory cells represent counting decades, whilst the two strings in the fifth group 1e of cells are used to store two further decades (the 10K and 100K decades). In this embodiment, which has six counting decades (100K's, 10K's, 1K's, 100's, 10's and 1's), only the four lower decades are provided with back-up strings of memory cells on the basis that the 100K and 10K registers are not worked sufficiently heavily to justify it.

Even though the 100K and 10K decades are not provided with any backup strings of cells, the strings are still provided with fault report flags since all the memory cells are arranged in an array and it is easier therefore to do so. These fault flags are assigned to special functions: for the 100K decade, the fault flag represents "overflow" or "tamper" to indicate when the maximum number of counts has been reached, inhibiting further counting; for the 10K decade, the fault flag is used as a "world fault report", being set upon the failure of any of the four lower decades and wired out to a pad, for example. This latter feature indicates the status of the counter, and hence whether special action is required.

Figures 2A, 2B:
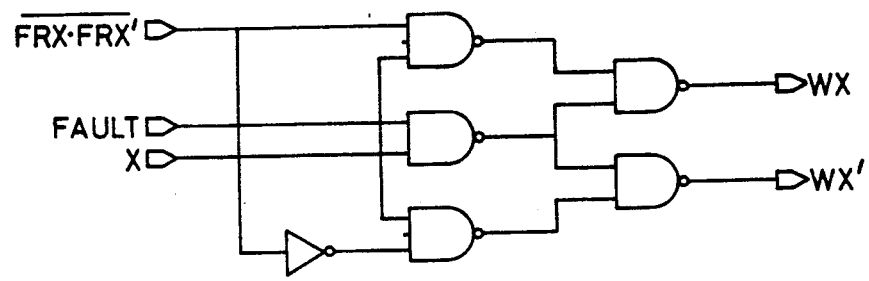

The logic circuitry incorporated in each logic means 5 is shown in detail in FIG. 2a. As can be seen, the circuitry includes 5 NAND gates and a NOT gate. The Truth table shown in FIG. 2b summarises the effect of the logic circuitry of FIG. 2a which controls the choice of word string X, X' accessed in each group 1 of cells in the memory array at any time.

The states of the fault flags of each group 1 of cells are fed back via a NOR gate to the logic means.

In use, the counter is originally set such that FRX and FRX' are set to "0" where X represents any of A, B, C or D (this may be achieved in the factory set-up routine). This configures the logic circuitry to select WX if X is activated by the address decoder; this is for normal read or write operations.

Figure 1:
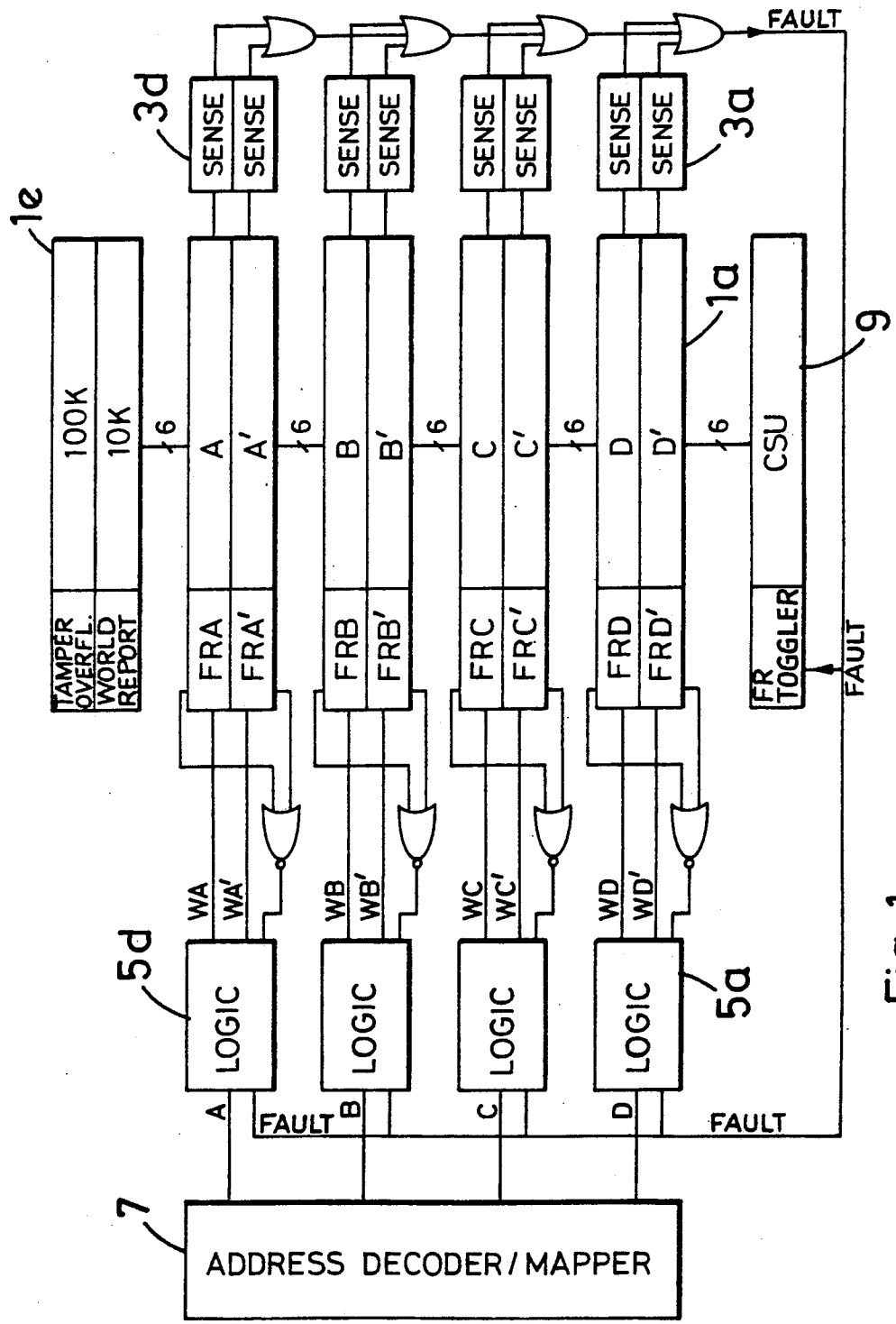
FIG. 1 is a schematic diagram of a counter according to the present invention.

Each time the decade holds the value "0", which is "00000" (five bits), then all the non-volatile transistors in the memory cells are ON. At this stage a SERIAL check is performed, such as described in co-pending U.K. Patent application no. (U.S. patent application Ser. No. 07/554,046, filed July 17, 1990) to determine whether any of the non-volatile transistors has failed. This is achieved by configuring all the non-volatile transistors in the word in series and checking the existence of a current path. The sensing means 3, which is an electronic circuit, shown in FIG. 1 performs this detection.

The fault flag memory cell (FR) is not included in the SERIAL check because it may well hold a "1" while the rest of the word is "00000". As this memory bit is not heavily used it is not necessary to check it.

If a fault is detected in the periodic check, then the sensing circuit 3 puts the FAULT signal high. This causes the sequencer to toggle the fault flag of the corresponding string of cells, thus ensuring that the logic means 5 selects the spare string X' in the same group 1 of cells. The FAULT signal from the sensing circuit 3 also overrides the X/X' selection performed by the spare-select logic means 5 such that, when the word is written back into the array, it is written into both X and X' simultaneously.

When the word has been written back into both the strings X, X' of the group, FRX and FRX' hold the same value, so FRX NOR FRX' is used as a logical input to the logic circuitry 5. As the counter progresses in its normal read/write routine, FRX NOR FRX' selects which of the strings of cells X or X' should be used.

If then the spare register also fails, the procedure is identical. The fault is detected, so FAULT is set high by the sensing circuitry 3 and the corresponding fault flag is toggled in the string via the CSU toggler. The new word is written into both string X and X', and the new state of the default flag causes operation to revert to the original word string. In this regard, although memory cells in both strings have faults, the strings of memory cells are still working because of the two-transistor redundancy in each memory cell. As the fault flags of both X and X' will continue to show a fault, the system will cause the data to be toggled from one word string to the other regularly as counting continues to take place in the group of memory cells recording the particular decade, thus sharing the work-load evenly between two non-perfect data word strings.

The system described above ensures that the one word string is used until it includes a memory cell having a failed non-volatile transistor, the second word string is then used until it includes a memory cell having a failed non-volatile transistor, after which the two strings are used alternately.

The scheme described is not dependent on array size, so any number of words in an array of any size can be equipped with spare words and associated fault report flags. This is rendered straight forward by the fact that the spare selection activity is invisible to the addressing and mapping circuitry.

Also possible with this system is the inclusion of a "leading-zero-blanking" bit (LZB) in each decade. This is set to (say) "0" during factory set-up, and is set to "1" the first time the decade is used. The hardware involved in providing the display can then differentiate between a leading zero (which is not displayed) and a non-leading zero (which is). The inclusion of LZB in the present scheme is straight forward, although the LZB bits must not be included in the periodic SERIAL check as they will frequently be at "1" when the rest of the word is at "00000". The same form of cell as that used for the fault flag bit may be employed. Possibly the sequencer may use the LZB bit as a periodic check inhibit signal; if the LZB bit is "0" then it is not worth checking the word as it has not yet been incremented from zero.

The present invention has been described above purely by way of example and modifications of detail can be made within the scope of the present invention.

We claim:

1. A counter comprising:
    an array of memory cells arranged in groups of memory cells, each group designating a counting decade, wherein each group of memory cells includes first and second work strings, each capable of storing a data word, and a fault flag, capable of indicating which work string contains a data word;
    sensing means coupled to the memory array for checking the status of the memory cells and for generating fault signals upon detection of a fault in a memory cell;
    logic means coupled to the fault flags and to the sensing means for selecting the first or second work string in response to a fault signal; wherein upon detection of a fault in a first work string, a data word is written into the second word string; and
    a central shifting unit coupled to the memory array for reading a data work stored in a word string into the shifting unit, incrementing the data word, and writing the incremented data word into its respective word string.

2. The counter of claim 1 wherein the sensing means includes a plurality of individual sensing circuits, each coupled to a particular group of memory cells.

3. The counter of claim 1 wherein the logic means includes a plurality of individual logic circuits, each coupled to a particular group of memory cells.

* * * * *